US010729028B2

United States Patent
Mehregany

(10) Patent No.: US 10,729,028 B2
(45) Date of Patent: *Jul. 28, 2020

(54) CONNECTED PACKAGING

(71) Applicant: QuantaEd, LLC, San Diego, CA (US)

(72) Inventor: Mehran Mehregany, San Diego, CA (US)

(73) Assignee: QuantaEd, LLC, San Diego, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/360,332

(22) Filed: Mar. 21, 2019

(65) Prior Publication Data

US 2019/0223312 A1 Jul. 18, 2019

Related U.S. Application Data

(63) Continuation of application No. 14/879,874, filed on Oct. 9, 2015, now Pat. No. 10,375,847.

(60) Provisional application No. 62/137,988, filed on Mar. 25, 2015, provisional application No. 62/062,291, filed on Oct. 10, 2014.

(51) Int. Cl.
*A61J 1/03* (2006.01)
*H05K 7/02* (2006.01)
*B65D 75/32* (2006.01)
*B65B 57/10* (2006.01)

(52) U.S. Cl.
CPC .............. *H05K 7/02* (2013.01); *A61J 1/035* (2013.01); *B65B 57/10* (2013.01); *B65D 75/327* (2013.01)

(58) Field of Classification Search
None
See application file for complete search history.

(56) References Cited

U.S. PATENT DOCUMENTS

| 4,616,316 A | 10/1986 | Hanpeter et al. |
| 4,617,557 A | 10/1986 | Gordon |
| 5,313,439 A | 5/1994 | Albeck |

(Continued)

FOREIGN PATENT DOCUMENTS

| AU | 2009238236 A1 | 12/2009 |
| CN | 101802648 A | 8/2010 |

(Continued)

OTHER PUBLICATIONS

Yongjia (Allen) Yao, "Wearable Sensor Scanner using Electrical Impedance Tomography", Sep. 26, 2012, Publisher: University of Bath, Country: UK.

(Continued)

*Primary Examiner* — Nasima Monsur
(74) *Attorney, Agent, or Firm* — Kaplan Breyer Schwarz, LLP

(57) ABSTRACT

Methods and systems for determining when a tablet has been removed from a blister pack are presented. A method includes measuring an electrical characteristic, such as electrical resistance or impedance, between at least two terminals that are in electrical communication with a lidding film included in the blister pack, wherein the removal of a tablet from the blister pack results in an opening in the lidding film, thereby giving rise to a finite change in the electrical characteristic. Another method determines the state of the blister pack using electrical resistance tomography or electrical impedance tomography.

21 Claims, 7 Drawing Sheets

(56) References Cited

U.S. PATENT DOCUMENTS

| | | | |
|---|---|---|---|
| 5,412,372 | A | 5/1995 | Parkhurst et al. |
| 5,852,590 | A | 12/1998 | De La Huerga |
| 6,411,567 | B1 | 6/2002 | Niemiec et al. |
| 6,839,304 | B2 | 1/2005 | Niemiec et al. |
| 7,028,723 | B1 | 4/2006 | Alouani et al. |
| 7,081,807 | B2 | 7/2006 | Lai |
| 7,113,101 | B2 | 9/2006 | Petersen et al. |
| 7,258,005 | B2 | 8/2007 | Nyce |
| 7,630,788 | B1 | 12/2009 | Reese |
| 7,821,404 | B2 | 10/2010 | Walker et al. |
| 7,928,835 | B1 | 4/2011 | Jovanov et al. |
| 8,025,149 | B2 | 9/2011 | Sterry et al. |
| 8,120,492 | B2 | 2/2012 | Scharfeld et al. |
| 8,152,020 | B2 | 4/2012 | Flowers et al. |
| 8,583,281 | B2 | 11/2013 | Bear et al. |
| 8,733,432 | B2 | 5/2014 | Labrecque |
| 8,878,654 | B2 | 11/2014 | Cohen-Alloro et al. |
| 8,960,440 | B1 | 2/2015 | Kronberg |
| 8,963,710 | B2 | 2/2015 | Huang et al. |
| 9,070,063 | B2 | 6/2015 | Carrender |
| 2005/0162979 | A1* | 7/2005 | Ostergaard ............ A61J 1/035 368/10 |
| 2005/0252924 | A1 | 11/2005 | Pieper et al. |
| 2010/0006441 | A1* | 1/2010 | Renaud ............ B01L 3/502746 204/643 |
| 2010/0089789 | A1* | 4/2010 | Rosenbaum ............ A61J 1/035 206/531 |
| 2010/0094455 | A1* | 4/2010 | Dehlin .................. A61J 7/0481 700/232 |
| 2011/0100862 | A1 | 5/2011 | Turkington et al. |
| 2012/0024889 | A1 | 2/2012 | Robertson et al. |
| 2012/0056000 | A1 | 3/2012 | Shores |
| 2012/0145573 | A1* | 6/2012 | Scharfeld ......... G06K 19/07749 206/223 |
| 2013/0085365 | A1 | 4/2013 | Marashdeh et al. |
| 2013/0126379 | A1 | 5/2013 | Medhal et al. |
| 2013/0222135 | A1 | 8/2013 | Stein et al. |
| 2013/0285681 | A1 | 10/2013 | Wilson et al. |
| 2013/0319902 | A1 | 12/2013 | Tufi |
| 2013/0330684 | A1 | 12/2013 | Dillon et al. |
| 2014/0055267 | A1 | 2/2014 | Rothschild |
| 2014/0118010 | A1 | 5/2014 | Fan et al. |
| 2014/0251850 | A1 | 9/2014 | Huang et al. |
| 2014/0255899 | A1 | 9/2014 | Poullain |
| 2014/0341411 | A1 | 11/2014 | Mohindra et al. |
| 2015/0286852 | A1 | 10/2015 | Sengstaken, Jr. |
| 2016/0103085 | A1 | 4/2016 | Mehregany |

FOREIGN PATENT DOCUMENTS

| | | |
|---|---|---|
| CN | 104302555 A | 1/2015 |
| GB | 2463054 A | 3/2010 |
| WO | 94/07184 A1 | 3/1994 |
| WO | 2008/079090 A1 | 7/2008 |
| WO | 2009/116108 A1 | 9/2009 |
| WO | 2010/045227 A1 | 4/2010 |
| WO | 2010/108838 A1 | 9/2010 |
| WO | 2012/111034 A1 | 8/2012 |
| WO | 2013/159198 A1 | 10/2013 |
| WO | 2015/191159 A2 | 12/2015 |

OTHER PUBLICATIONS

Yang et al., "A Health-IoT Platform Based on the Integration of Intelligent Packaging, Unobtrusive Bio-Sensor and Intelligent Medicine Box", "Transactions on Industrial Informatics", 2014, pp. 1-13, Publisher: IEEE; DOI: 10.1109/TII.2014.2307795.

Todd O'Connor, "mTouch (TM) Projected Capacitive Touch Screen Sensing Theory of Operation", ISBN:978-1-60932-466-7, Publisher: Microchip Technology Inc., vol. DS93064A, pp. 1-16, Jan. 5, 2010, US.

Silva et al., "Influence of current injection pattern and electric potential measurement strategies in electrical impedance tomography", Mar. 2, 2016, Publisher: Elsevier Ltd., Publication: "Control Engineering Practice", http://dx.doi.org/10.1016/j.conengprac.2016.03.003, Country: BR.

Sarkar et al., "Efficient 2D and 3D electrical impedance tomography using dual reciprocity boundary element techniques", "Engineering Analysis with Boundary Elements", Jul. 1998, Publisher: Research Gate.

Officer: Ioannis Kousouretas, "International Search Report", PCT/US2016/055535, Completed Jan. 16, 2017.

Officer: Jean Sommer, "International Search Report", PCT/US2016/055516, Completed Jan. 5, 2017.

Officer: Hong Djien Ong, "International Search Report and the Written Opinion", International Patent Application No. PCT/US2017/025302, Search Completed Jun. 8, 2017, 12 pp.

Notice of Allowance received for U.S. Appl. No. 15/223,779, dated Aug. 9, 2018, 09 pages.

Non-Final Rejection received for U.S. Appl. No. 15/170,121, dated Mar. 7, 2019, 21 pages.

Non-Final Rejection received for U.S. Appl. No. 14/879,874, dated Feb. 26, 2019, 40 pages.

Non-Final Office Action received for U.S. Appl. No. 15/170,121, dated Nov. 20, 2017, 17 pages.

Non-Final Office Action received for U.S. Appl. No. 14/879,874, dated Oct. 10, 2017, 29 pages.

Final Office Action received for U.S. Appl. No. 15/170,121, dated May 29, 2018, 20 pages.

Final Office Action received for U.S. Appl. No. 14/879,874, dated May 14, 2018, 35 pages.

"Non Final Office Action" issued in U.S. Appl. No. 15/223,779 dated Sep. 8, 2017.

"Non-Final Rejection" issued in U.S. Appl. No. 15/170,121, dated Nov. 20, 2017.

"Notice of Allowance" issued in related U.S. Appl. No. 15/223,779, dated Apr. 19, 2018.

Examiner initiated interview summary (PTOL-413B) received for U.S. Appl. No. 15/170,121, dated Aug. 3, 2018, 1 pages.

Authorized Officer: Melissa Koval, "International Preliminary Report on Patentability" dated Sep. 1, 2017 in PCT Application No. PCT/US16/55516.

Ariel Bogle, "Soon Your Medicine Bottle Could Remind You to Take Your Pills", "Future Tense—The Citizen's Guide to the Future", Aug. 19, 2013, Publisher: ASU I New America I Slate.

Applicant Initiated Interview Summary received for U.S. Appl. No. 15/170,121, dated Jul. 5, 2018, 3 pages.

Applicant Initiated Interview Summary received for U.S. Appl. No. 14/879,874, dated Jul. 5, 2018, 3 pages.

Applicant Initiated Interview Summary (PTOL-413) received for U.S. Appl. No. 14/879,874, dated Mar. 13, 2019, 3 pages.

Advisory Action (PTOL-303) received for U.S. Appl. No. 15/170,121, dated Aug. 3, 2018, 4 pages.

Advisory Action (PTOL-303) received for U.S. Appl. No. 14/879,874, dated Aug. 1, 2018, 3 pages.

"The Most Accurate Smart Blister in the World", "med-ic Smart Label", 2011, Publisher: IMC Information Mediary Corp.

"SMRxT Realtime Medication Adherence", 2012-2014, Publisher: SMRxT Inc.; http://smrxl.com/index.php.

Advisory Action received for U.S. Appl. No. 16/179,287, dated Oct. 10, 2019, 3 pages.

Applicant Initiated Interview Summary received for U.S. Appl. No. 16/179,287, dated Oct. 3, 2019, 3 pages.

Authorized Officer Shane Thomas, International Search Report and Written Opinion issued in International Patent Application No. PCT/US18/55267 dated Dec. 11, 2018.

Authorized Officer: Gkama, Alexandra, International Search Report and Written Opinion issued in PCT patent application No. PCT/US2018/019289, dated May 16, 2018, 11 pp.

English Translation of Office Action issued in Japanese Patent Application No. 2018-538051 dated Nov. 25, 2019.

Examiner initiated interview summary (PTOL-413B) received for U.S. Appl. No. 14/879,874, dated Jun. 3, 2019, 2 pages.

Examiner initiated interview summary received for U.S. Appl. No. 16/179,287, dated Oct. 31, 2019, 1 pages.

(56) References Cited

OTHER PUBLICATIONS

Examiner initiated interview summary received for U.S. Appl. No. 16/290,656, dated Jul. 30, 2019, 1 page.
"Non-Final Office Action", U.S. Appl. No. 14/879,874, dated Oct. 10, 2017.
"Final Rejection" issued in related U.S. Appl. No. 14/879,874 dated May 14, 2018.
Office Action issued in counterpart Chinese patent application No. 201780030375.4, dated Jul. 3, 2019, 14 pp.
Final Rejection dated May 29, 2018 for U.S. Appl. No. 15/170,121.
Final Rejection received for U.S. Appl. No. 16/179,287, dated Aug. 1, 2019, 11 pages.
Non-Final Office Action received for U.S. Appl. No. 15/223,779, dated Sep. 8, 2017, 13 pages.
Non-Final Rejection dated Feb. 8, 2019 for U.S. Appl. No. 16/179,287.
Non-Final Rejection dated Oct. 10, 2017 for U.S. Appl. No. 14/879,874.
Non-Final Rejection received for U.S. Appl. No. 16/100,430, dated Jan. 25, 2019, 7 pages.
Non-Final Rejection received for U.S. Appl. No. 16/179,287, dated Feb. 8, 2019, 9 Pages.
Non-Final Rejection received for U.S. Appl. No. 16/290,656, dated Jun. 28, 2019, 6 pages.
Notice of Allowance and Fees Due (PTOL-85) dated Aug. 9, 2018 for U.S. Appl. No. 15/223,779.
Notice of Allowance and Fees Due (PTOL-85) received for U.S. Appl. No. 14/879,874, dated Jun. 3, 2019, 19 pages.
Notice of Allowance and Fees Due (PTOL-85) received for U.S. Appl. No. 16/100,430, dated Mar. 13, 2019, 8 pages.
Notice of Allowance received for U.S. Appl. No. 15/223,779, dated Apr. 19, 2018, 8 pages.
Notice of Allowance received for U.S. Appl. No. 16/179,287, dated Oct. 31, 2019, 9 pages.
Notice of Allowance received for U.S. Appl. No. 16/290,656, dated Jul. 30, 2019, 9 pages.
Office Action received for European Patent Application No. 16791135.3, dated Mar. 29, 2019, 4 pages.
Officer: Jean Sommer, "International Search Report and Written Opinion", PCT/US2016/055516, Completed Jan. 5, 2017.
Officer: Ioannis Kousouretas, "International Search Report and Written Opinion", PCT/US2016/055535, Completed Jan. 16, 2017.
Office Action issued in counterpart European patent application No. 17719957.7, dated Aug. 5, 2019, 7 pp.
Ramani Duraiswami et al., "Efficient 2D and 3D electrical impedance tomography using dual reciprocity boundary element techniques", "Engineering Analysis with Boundary Elements", Abstract only, Sep. 21, 1998, Publisher: Elsevier B.V., 13-31, vol. 22, Iss 1, https://doi.org/10.1016/S0955-7997(98)00028-9.

\* cited by examiner

FIG. 1A
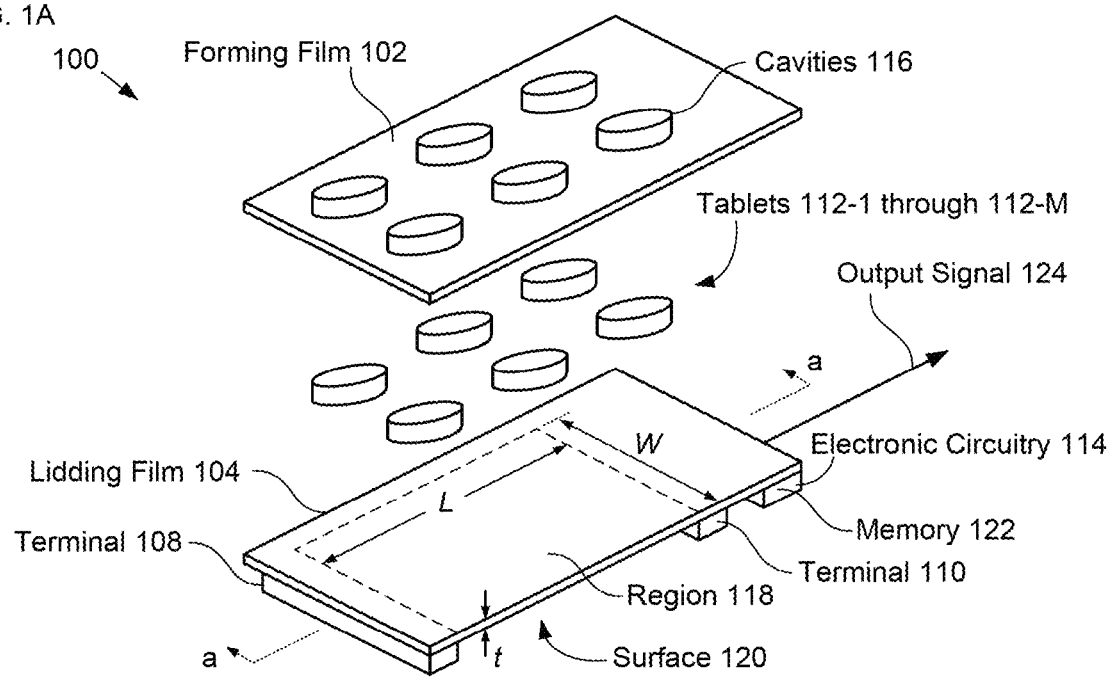
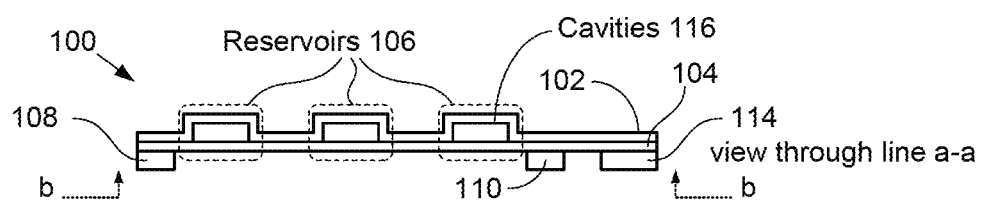
FIG. 1B

CONNECTED PACKAGING

CROSS REFERENCE TO RELATED APPLICATIONS

This case is a continuation of co-pending U.S. Nonprovisional application Ser. No. 14/879,874, filed Oct. 9, 2015 claims priority of U.S. Provisional Patent Application Ser. No. 62/062,291, filed Oct. 10, 2014 and U.S. Provisional Patent Application Ser. No. 62/137,988, filed Mar. 25, 2015, each of which is incorporated by reference. If there are any contradictions or inconsistencies in language between this application and one or more of the cases that have been incorporated by reference that might affect the interpretation of the claims in this case, the claims in this case should be interpreted to be consistent with the language in this case.

FIELD OF THE INVENTION

The present invention relates to packaging in general, and, more particularly, to smart packaging.

BACKGROUND OF THE INVENTION

The term "packaging" refers to the collection of different components that surround a product from the time of its production until its use. It typically serves many purposes, often simultaneously, such as providing protection from physical damage during shipping and handling, theft deterrence, inhibiting contamination, providing protection from electrical damage due to electrostatic discharge, etc., preventing tampering, inhibiting product degradation, and the like.

In recent years, blister packaging has become a primary form of packaging for many products, such as toys, hardware, electronics, and medications. The primary component of a blister pack is a cavity made in a formable layer, which usually is made of a type of thermoformed plastic. In some cases, the formable layer is folded back onto itself, thereby sealing the cavity and forming a "clamshell" package. More typically, a lidding seal of metal foil is joined to the formable layer as a backing layer to seal the cavities thereby forming one or more enclosed reservoirs.

As blister packaging has become rather ubiquitous, there has been increasing interest in improving its utility by adding intelligence. Referred to as "smart," "active," or "connected" packaging, such packages include sensors and monitoring circuitry that can be used to provide product status, monitor freshness, track temperature exposure, record shocks imparted to the package, send an alert when one or more product units have been removed from a package, and the like. Further, it is possible to include complex product codes that are very difficult to copy, thereby frustrating counterfeit attempts. As a result, such added intelligence can enhance theft deterrence, inhibit product counterfeiting, enable tracking of product end-to-end (i.e., from production to the consumer), etc.

Unfortunately, conventional approaches for providing intelligent packaging are typically complex, expensive and often easily damaged.

The simplest prior-art approach relies on patterned electrical traces that are arranged such that they are broken during the removal of a unit from the package. For multi-unit blister packs, a separate trace is normally disposed over each reservoir. Electronic circuitry monitors the resistance of each trace and generates a signal when infinite resistance for one of the traces is detected. Unfortunately, incorporating patterned traces into a blister pack requires a significant modification of conventional packaging approaches. As a result, it adds significant complexity and cost. Further, narrow conductive traces are subject to corrosion and physical damage that can give rise to false indications of unit removal.

Another prior-art smart-packaging approach relies on optical monitoring of product units contained in a package. The need to include active optical sources, as well as detectors, significantly increases packaging costs, however. Further, such devices are notoriously power hungry, which shortens the life of a battery used to power them.

Yet another conventional smart-packaging approach employs radio-frequency identification (RFID) tags that are associated with each unit contained in a package. Although this enables highly reliable tracking of the products packaged, these approaches require specialized base stations capable of energizing and reading the RFID tags. Further, the range over which the RFID tags are operable is fairly short. Still further, most RFID-based approaches require patterning of the metal-foil lidding-seal layer to form the requisite antenna that enables RF communication with the tag.

The need for a simple, lower-cost smart-packaging approach that enables end-to-end tracking of a packaged product remains, as yet, unmet.

SUMMARY OF THE INVENTION

The present invention enables tracking of a product, such as drugs, medication, foodstuffs, consumer electronics products, batteries, etc., from production to consumption through connected packaging. Embodiments of the present invention are operative for wirelessly reporting medication adherence, environmental exposure (e.g., temperature, shock, chemical exposure, etc.), tampering, and theft.

An illustrative embodiment of the present invention is a smart package for pharmaceutical products. The package includes a first layer that is electrically conductive and unpatterned, first and second terminals that are electrically connected to the first layer such that they are in electrical communication through the first layer, a second layer having a plurality of cavities, and electronic circuitry for monitoring the electrical resistance between the first and second terminals and providing an output signal indicative of the formation of openings in the first layer. The first and second layers are joined such that the first layer and the cavities collectively define a plurality of reservoirs, each reservoir being operative for locating a medicinal tablet. In some embodiments, the reservoirs are operative for holding another medicinal product unit, such as a pill, capsule, lozenge, and the like. In some embodiments, the reservoirs are operative for holding another production unit, such as a toy, a foodstuff, an electronic product, etc.

In some embodiments, the first layer includes an electrically non-conductive film and an electrically conductive film, where the non-conductive film is between the conductive film and at least one of a plurality of terminals. In such embodiments, the terminals are capacitively coupled to the conductive film using an alternative current signal and are therefore, electrically coupled through the first layer. In such embodiments, the electronic circuitry is operative for providing the alternating current signal to the terminals and monitoring electrical impedance between them.

In some embodiments, a plurality of terminals are arranged around the perimeter of an area of the first layer and electrically coupled through the first layer such that an electrical parameter (e.g., electrical resistance or impedance) can be measured between each terminal and each other terminal of the plurality of terminals. In some embodiments, the electrical parameter between each terminal and each other terminal is used to develop a map of the electrical parameter over an area of the first layer. In some embodiments, the map is generated by a processor using electrical resistance tomography or electrical impedance tomography techniques. In some embodiments, the processor is included in the electronic circuitry of the package. In some embodiments, the processor is an external processor that is in communication with the electronic circuitry.

In some embodiments, the electronic circuitry includes a wireless communications device that enables wireless communications from and/or to the package.

An embodiment of the present invention is an apparatus for containing one or more product units, the apparatus comprising: a first layer; a plurality of terminals operatively coupled with the first layer, each terminal being in electrical communication with each other terminal of the plurality thereof through the first layer, wherein the plurality of terminals are arranged such that formation of an opening in the first layer at a first location gives rise to a first finite change in the magnitude of an electrical parameter measured between first and second terminals of the plurality thereof; and electronic circuitry that is operative for providing a first signal based on the first finite change in the magnitude of the electrical parameter.

Another embodiment of the present invention is an apparatus for containing one or more product units, the apparatus comprising: a first layer that is substantially continuous throughout a first region; a second layer including one or more cavities, wherein the first layer and second layer are joined such that each of the one or more depressions and the first layer collectively defines a reservoir that is operative for holding a product unit; a plurality of terminals that is arranged such that each terminal is in electrical communication with each other terminal of the plurality thereof through the first layer before and after formation of an opening in the first layer; and electronic circuitry that is operative for providing (1) a first signal based on a first finite change in the magnitude of an electrical parameter measured between first and second terminals of the plurality thereof and (2) a second signal based on the time at which the first finite change in the magnitude of the electrical parameter is detected.

Another embodiment of the present invention is a method for monitoring the state of a package, the method comprising: monitoring an electrical parameter between at least two terminals of a plurality of terminals, the plurality of terminals being arranged such that each terminal is in electrical communication with each other terminal of the plurality thereof through a first layer; and providing a first signal that indicates (1) the formation of a first opening in a first region of the first layer when a first finite change in the magnitude of the electrical parameter measured between first and second terminals of the plurality thereof is detected, and (2) a first time at which the first finite change in the magnitude of the electrical parameter is detected.

BRIEF DESCRIPTION OF THE DRAWINGS

FIG. 1A depicts a schematic drawing of an exploded view of a blister pack in accordance with an illustrative embodiment of the present invention.

FIG. 1B depicts a schematic drawing of a cross-sectional view of blister pack 100 after its assembly.

DETAILED DESCRIPTION

Figure 2:
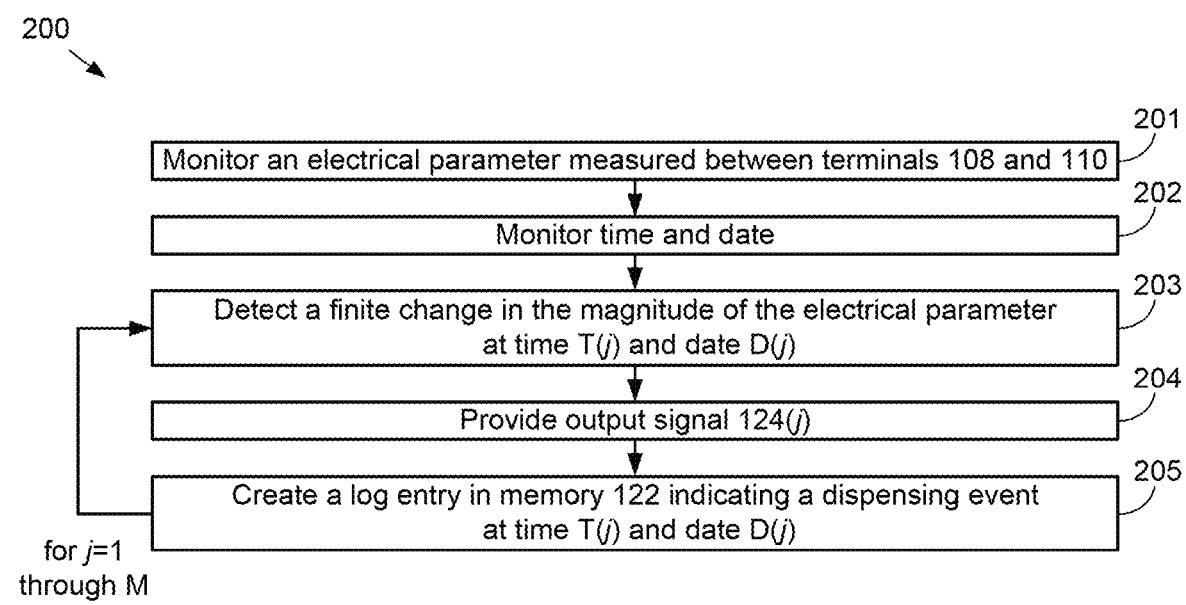
FIG. 2 depicts operations of a method suitable for monitoring the state of a blister pack in accordance with the illustrative embodiment.

The present invention is directed toward smart blister packaging for use across a variety of packaging applications, including consumer electronics, toys, healthcare products (e.g., razor blades, etc.), foodstuffs, toner cartridges, and the like. It should be noted, however, that it is particularly well suited for use in pharmaceutical packaging.

For many medicinal products, blister packaging has become the dominant form of packaging; however, it is a broad, encompassing, and multi-faceted task. It is responsible for providing life-saving drugs, medical devices, medical treatments, and new products like medical nutritionals (nutraceuticals) in every imaginable dosage form to deliver every type of supplement, poultice, liquid, solid, powder, suspension, or drop to people the world over.

Although some medicinal packaging efforts to frustrate "tampering" of medicinal products have been made (e.g., non-resealable tamper indicators, such as tapes, foil seals, etc.), on the whole, most drugs and medicines are still packaged in a manner that primarily addresses only environmental concerns, such as humidity, oxidation, light, contamination, etc. It is an aspect of the present invention, however, that smart packaging can add value and provide solutions to many issues plaguing the healthcare industry—in particular, improving patient compliance with self-dosing regimens. Smart packaging in accordance with the present invention, for example, enables certain events, such as a dosing event, to be prompted and/or logged, and/or communicated with a care provider.

It should be noted that patient compliance is one of the most vexing problems facing the health care industry today. Nearly three out of four Americans do not take their medications as directed, which results in serious health consequences—especially for people with chronic diseases. In developed countries, adherence to long-term therapies in the general population is around 50% on average, but is much lower in developing countries. The failure of patients to adhere to prescribed medication regimens directly contributes to poor drug efficacy, higher medical care costs due to an increased need for acute care, and financial losses to the pharmaceutical industry. The impact of poor patient compliance is blamed for:

125,000 patient deaths per year in just the United States;
up to $290 billion per year of additional healthcare costs; and losses for the global pharmaceutical market of an estimated $564 billion annually, which corresponds to 59% of the $956 billion in total global pharmaceutical revenue in 2011.

In addition, the theft and counterfeiting of drugs has become a critical issue with worldwide health ramifications. Counterfeiting is estimated to be in the range of 2% worldwide; however, it is concentrated in developing countries, where it is estimated to be as high as 60% in some regions. The consequences of counterfeit drugs can be dire, including negative side effects, poor or non-existent efficacy, and death in many cases. Further, while medication theft makes up only 5% of all cargo theft by volume, the average value of stolen medication is $3.78 million per robbery. The direct economic impact on drug producers can be significant, hitting some companies extremely hard in recent years. Even beyond the significant loss of money and trial delays due to lost product, pharmaceutical theft also carries hidden consequences, such as damage to a company's reputation and the need to recall products not yet released to market. Further, stolen medicines can end up in the legitimate supply chain and pose a severe risk to patients that receive it.

Connected packaging in accordance with the present invention has positive implications for the complete life cycle of a drug—from production to consumption. Embodiments of the present invention enable:
  i. improved patient adherence/compliance; or
  ii. increased efficacy; or
  iii. abiding by prescribed timing, dosage, refills, etc.; or
  iv. improved treatment outcome through improved results enabled by;
    a. better engagement with patients; or
    b. improved ability to measure and provide feedback on therapies/efficacy, thereby providing opportunities for caregivers to improve treatment outcomes, pharmaceutical companies to improve revenue control and cost management; or
    c. improved ability to collect and analyze user data; or
  v. new distribution models (e.g., direct sales from supplier to customer); or
  vi. improved drug control (e.g., theft prevention, anti-counterfeiting, etc.); or
  vii. expedited clinical trials; or
  viii. opportunities for new diagnostic capabilities;
  ix. any combination of i, ii, iii, iv, v, vi, vii, and viii.

FIG. 1A depicts a schematic drawing of an exploded view of a blister pack in accordance with an illustrative embodiment of the present invention.

FIG. 1B depicts a schematic drawing of a cross-sectional view of blister pack 100 after its assembly. FIG. 1B depicts a cross-section of blister pack 100 taken through line a-a, as shown in FIG. 1A.

Blister pack 100 comprises forming film 102, lidding film 104, reservoirs 106, terminals 108 and 110, tablets 112, and electronic circuitry 114. Blister pack 100 is often referred to as a "push-through pack," because lidding film 104 is designed to allow each tablet 112 to be removed by pushing it through the lidding film by forcibly collapsing any of the semi-rigid formed cavities in the forming film. One skilled in the art will recognize, however, that the present invention is suitable for use with other types of packaging as well, such as medical blister trays, peel-open blister packs, and the like. Further, although the embodiments described herein are substantially rectangular blister packs, in some embodiments, blister pack 100 has a shape other than rectangular, such as circular, elliptical, polygonal, square, or irregular. In some embodiments, one or more terminals are located in the interior of blister pack 100.

Blister pack 100 is a single, unfolded blister card. In some embodiments, blister pack 100 includes multiple blister cards, each of which holds one or more tablets, where the blister cards are physically and electrically connected but perforated along "fold lines" that facilitate fanning them into an easily packaged unit. For the purposes of this Specification, including the appended claims, a region of a layer that is unpatterned but includes perforated fold lines is considered to be substantially continuous.

One skilled in the art will recognize that many types of medication are offered in a form suitable for packaging in a blister package, such as pills, capsules, lozenges, etc. For the purposes of this Specification, including the appended claims, the term "tablet" is used as a general term that encompasses all such medicinal forms.

Forming film 102 is a layer of thermoformed plastic comprising cavities 116 (i.e., blisters). Cavities 116 are typically formed via a conventional thermoforming process, wherein the forming film is heated and pressed into features of a forming tool. One skilled in the art will recognize that there are myriad suitable alternative methods for making forming film 102 without departing from the scope of the present invention.

Each of cavities 116 is filled with one of tablets 112-1 through 112-M, where M is the total number of medicinal doses included in blister pack 100 (in the illustrative embodiment, each dose includes a single tablet 112 and M=6). Tablets 112-1 through 112-M are loaded into their respective cavities in conventional fashion. The loading process is normally monitored using an automated vision system to ensure that no cavities are empty, contain multiple tablets, or have damaged tablets. In some embodiments, at least one of cavities 116 includes a plurality of tablets 112.

Lidding film 104 is a layer of metal foil, such as aluminum foil, suitable for pharmaceutical applications. Lidding film 104 is joined with forming film 102 in conventional fashion, using localized heat and pressure to seal the lidding film against the edges of the cavities. Once forming film 102 and lidding film 104 are joined, the lidding film and cavities 116 collectively define reservoirs 106. Reservoirs 106 are located within region 118, which is an area of the blister pack that is clear of additional structure so as to facilitate the removal and capture of tablets 112 when they are dispensed by pushing them through the lidding film.

In some embodiments, surface 120 of lidding film 104 includes printed information, such as dosage schedule, emergency procedures, and the like. In some embodiments, lidding film 104 is a multi-layer film including a metal layer and a thin electrically non-conductive layer (e.g., a paper layer on which information is printed, etc.). In some embodiments, a conductive layer is added to a non-conductive lidding film as part of the fabrication process for blister pack 100.

In some embodiments, blister pack 100 is perforated along lines to define individual, easily separated blister cards, each containing at least one reservoir 116.

Terminals 108 and 110 are electrical contacts disposed on surface 120 at either end of region 118. Terminals 108 and 110 enable electrical connection to electronic circuitry 114. Terminals 108 and 110 are disposed on surface 120 such that the terminals are in electrical communication through lidding film 104.

In some embodiments, terminals 108 and 110 are formed directly on surface 120 using an electrically conductive printing ink. In some of these embodiments, the terminals are formed during the printing of user information on the film, as discussed above. In some embodiments, electrical traces suitable for interconnecting terminals 108 and 110 with electronic circuitry 114 are also formed on the blister pack using electrically conductive ink.

Electronic circuitry 114 includes sensor circuitry for monitoring the resistance of region 118, memory module 122 for logging date and time, a wireless device for communicating with the user and/or a medical services provider, and a module for tracking the chain of custody of blister pack 100. Electronic circuitry 114 is mounted on surface 120 via conventional hybrid bonding techniques such that it is electrically coupled with terminals 108 and 110. In some embodiments, electronic circuitry 114 is formed directly on lidding film 104 using, for example, thin-film transistor technology, such as is used in the fabrication of active-matrix liquid-crystal displays, etc. In some embodiments, electronic circuitry 114 includes additional sensors for monitoring, for example, environmental factors (e.g., humidity, temperature, etc.), storage duration, light exposure, and the like. In some embodiments, electronic circuitry 114 includes visual and/or audible status indicators for providing user information such as dosage reminders, expiration date warnings, tamper alerts, etc. In some embodiments, electronic circuitry 114 communicates information to and/or from blister pack 100 via a wired communications link. In some embodiments, electronic circuitry 114 includes additional functionality, such as signal processing/computation, and a power module (e.g., inductive energy-coupling system, battery pack, an energy scavenging system, etc.).

Preferably, embodiments of the present invention are substantially compatible with conventional blister packaging user experience and manufacturing. It is desirable, therefore, that blister packs in accordance with the present invention be untethered and, further, that medication dispensing should not place an added burden on the user. As a result, electronic circuitry 114 typically includes a wireless communication device that enables information to be wirelessly transmitted to and/or from blister pack 100. In addition, in some embodiments, the electronics module enables the blister pack to be "self-reporting." The choice of wireless protocol is generally dominated by power and cost requirements. Broadband/cellular communication is most desirable since it does not require a local/short-range gateway to reach the network; however, it is also the most taxing in power and cost. Attractive alternatives include short-range wireless protocols (e.g., Blue Tooth Low Power, Near Field Communication, Inductive Coupling, etc.) to communicate with a local gateway (e.g., user's cell phone, custom transmission system, docking station, etc.). One skilled in the art will recognize that such approaches require that the blister pack be near the local gateway when the data is to be retrieved (e.g., during dispensing or subsequent downloading of dispensing history).

In some embodiments, electronic circuitry 114 is located, at least in part, in a module external to blister pack 100. In some embodiments, electronic circuitry 114 is included, at least in part, in a docking station that accepts and locates blister pack 100 and establishes electrical connectivity with terminals 108 and 110.

FIG. 2 depicts operations of a method suitable for monitoring the state of a blister pack in accordance with the illustrative embodiment. Method 200 begins with operation 201, wherein an electrical parameter measured between terminals 108 and 110 is monitored. In the illustrative embodiment, the electrical parameter measured between terminals 108 and 110 (i.e., of region 118) is electrical resistance.

In some embodiments, lidding film 104 includes an electrically non-conductive film and an electrically conductive film, wherein the non-conductive film is between the electrically conductive film and terminals 108 and 110 (or between the electrically conductive film and at least one of the terminals). As a result, the terminals are not electrically connected with the first layer and electrical resistance between the terminals cannot be effectively measured. By driving the terminals with an alternating current (AC) signal, however, the terminals are still electrically coupled through the first layer by virtue of capacitive coupling between each terminal and the conductive film. In such embodiments, electronic circuitry 114 is operative for providing an alternating current (AC) signal to the terminals and measuring electrical impedance between the them (i.e., the measured electrical parameter is electrical impedance).

In some embodiments, lidding film 104 includes an electrically non-conductive film and an electrically conductive film, as described above; however, the non-conductive film includes openings that enable each of the terminals to be in direct electrical contact with the conductive film. In such embodiments, therefore, the measured electrical parameter can be electrical resistivity.

The magnitude of the electrical resistance, R, of region 118 is given by R=ρL/Wt, where ρ and t are the resistivity and thickness, respectively, of the metal that composes the lidding film, L is the distance between terminals 108 and 110, and W is the width of the terminals, which defines the width of region 118.

At operation 202, electronic circuitry 112 monitors date and time.

It is an aspect of the present invention that each time a tablet is dispensed from blister pack 100, a corresponding finite change in the magnitude of the electrical resistance of region 118 occurs.

At operation 203, a finite change in the measured electrical parameter is detected at date D(j) and time T(j), where j is an integer within the range of 1 through M. As discussed above, M is the number of doses included in blister pack 100. For the purposes of this Specification, including the appended claims, a "finite change" in an electrical parameter is defined as a change from a first non-infinite value to a second non-infinite value. This definition explicitly excludes a change from a first non-infinite value to infinity, such as, for example, a change in the resistance of a conductive trace upon to its breakage.

Figure 3:
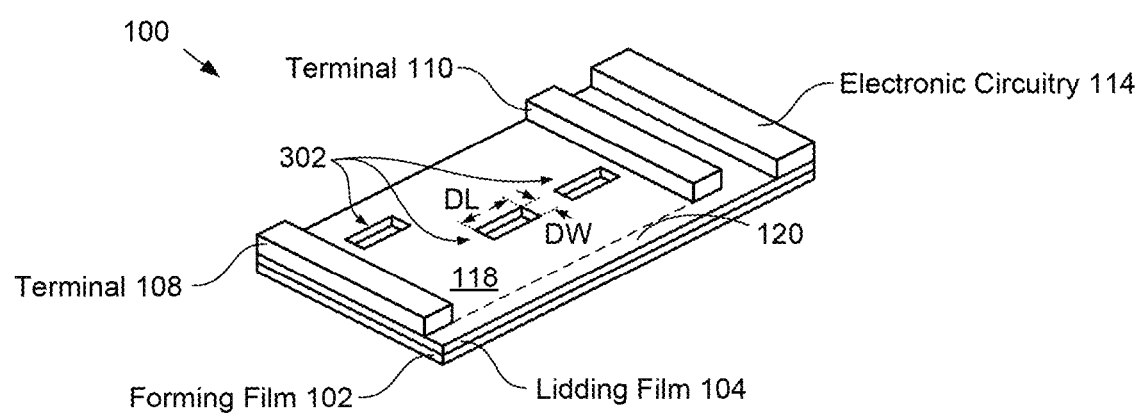
FIG. 3 depicts a schematic drawing a perspective view of blister pack 100 after the removal of tablets from the package.

FIG. 3 depicts a schematic drawing a perspective view of blister pack 100 after the removal of tablets from the package. The view of blister pack 100 shown in FIG. 3 is that of view b-b, as shown in FIG. 1B. The removal of a tablet 112 gives rise to an opening 302 in lidding film 104, since a tablet is dispensed from the package by pressing against a cavity 116 to push it through the lidding film. It should be noted that, for illustrative purposes, openings 302 are depicted as identical rectangular holes. In practice, however, openings 302 are typically neither rectangular nor identical. Further, it is common for one or more holes to include metal foil that is merely broken out of, but not removed completely from, lidding film 104.

Each opening in lidding film 104 removes some conductive material from the electrical path between terminals 108 and 110 (i.e., region 118). The removal of this conductive material gives rise to a discernable, finite change in the magnitude of the resistance measured between terminals 108 and 110. For an illustrative example wherein identical rectangular holes 202 that have width ΔW and length ΔL, are formed in lidding film 104, the change in resistance, ΔR, that occurs due to the formation of a hole 202 is given by:

$$\Delta R = R\left(\frac{\Delta L}{L} - \frac{\Delta W}{W}\right).$$

For an exemplary circular hole shape, (i.e., ΔL=ΔW) and a ratio of L/W of 2, ΔR is given by:

$$\Delta R = R\left(\frac{\Delta W}{2W}\right).$$

By monitoring the change in the electrical resistance between terminals 108 and 110, therefore, the present invention detects the removal of a tablet, how many tablets are dispensed per event, and a record of dispensing events.

At operation 204, electronic circuitry 114 generates output signal 124(*j*), which indicates that a tablet 112 has been dispensed from blister pack 100, as well as the date D(j) and time T(j) at which the tablet was dispensed. In some embodiments, output signal 122 includes additional information, such as how many tablets 112 were dispensed, and the like.

At operation 205, electronic circuitry 114 creates a log entry in memory 122 that includes the number of tablets dispensed at date D(j) and time T(j).

Further, by extending the foregoing approach and adding additional terminals arranged around region 118, it is possible to determine the location within region 118 from which each tablet is dispensed, as well as improving the robustness of determining dispensing events and numbers.

Figure 4:
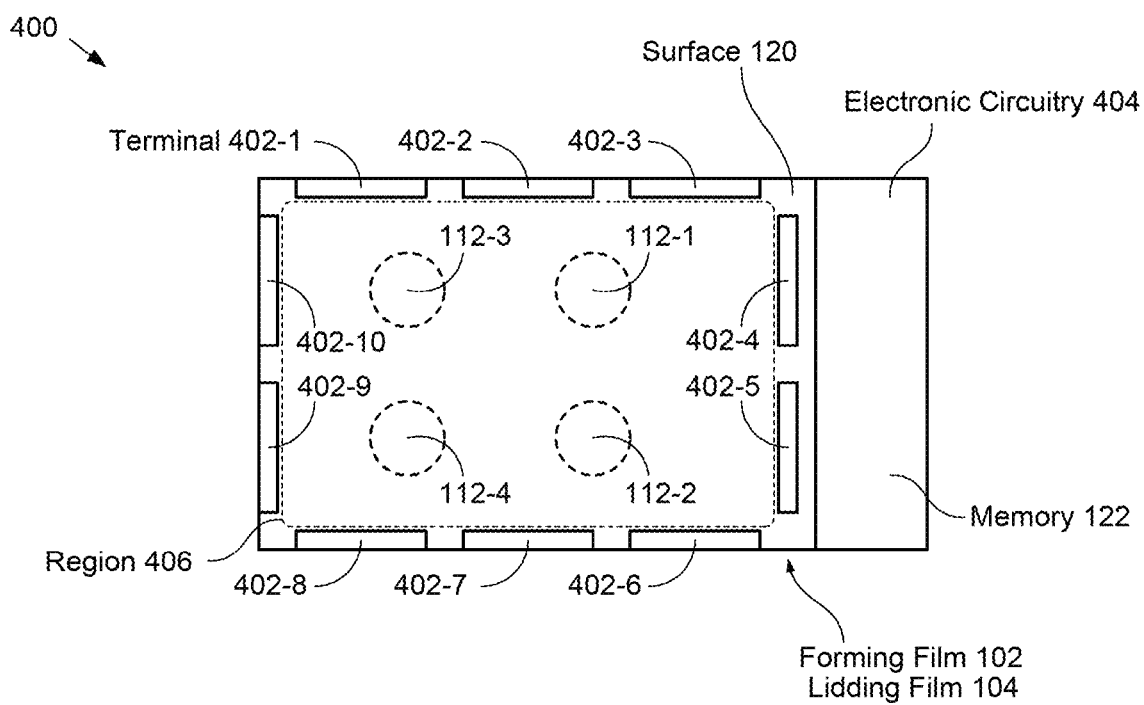
FIG. 4 depicts a schematic drawing of a plan view of a blister pack in accordance with a first alternative embodiment of the present invention.

FIG. 4 depicts a schematic drawing of a plan view of a blister pack in accordance with a first alternative embodiment of the present invention. Blister pack 400 comprises forming film 102, lidding film 104, reservoirs 106, terminals 402-1 through 402-N, tablets 112, and electronic circuitry 404. Blister pack 400 is analogous to blister pack 100 described above and with respect to FIGS. 1-3; however, blister pack 400 includes a greater number of terminals, which are distributed around the perimeter of region 118. It should be noted that, although the embodiment depicted in FIG. 4 includes ten terminals 402 (i.e., N=10), it will be clear to one skilled in the art, after reading this Specification, how to specify, make, and use embodiments of the present invention comprising any practical number of terminals 402 (i.e., wherein N is any practical number).

The addition of eight additional terminals around the perimeter of lidding film 104 improves the sensing resolution of blister pack 400 beyond that of blister pack 100, such that the identity of which individual tablet has been dispensed can be determined. The configuration of terminals 402-1 through 402-10 (referred to, collectively, as terminals 402) enables forty five pair-wise measurements of the electrical resistance between the ten terminals. This enables sufficient resolution for sensing the location of each dispensed tablet—both per dispensing event and historically. One skilled in the art will recognize that the sensing resolution achievable is based upon the number and location of the dispensed tablets on the blister pack, as well as the size and density of the blisters, the relative distance of the blisters from the terminals, and the size, shape, number and location of the terminals.

Electrical resistance tomography (ERT) imaging (a.k.a., electrical resistance imaging (ERI)) and electrical impedance tomography (EIT) are well-known techniques used for imaging tissue in medical applications. An exemplary method for determining the location of one or more openings formed in region 406 in accordance with the present invention is based on analogous electromagnetic and mathematical modeling techniques, such as those described in U.S. Pat. No. 8,733,432, and by Duraiswami, et al., in "Efficient 2D and 3D EIT using dual reciprocity boundary element techniques," *Engineering Analysis with Boundary Elements*, Vol. 22, pp. 13-31 (1998), each of which is incorporated herein by reference. In such approaches, a forward model of a system is first developed by modeling the system for a plurality of potential configurations of a parameter of interest. These modeled configurations are then stored in a look-up table. An unknown parameter configuration is then reconstructed by making measurements of the system, whose results are then compared to those predicted by the stored models. Typically, an iterative algorithm is used in doing so, identifying features of interest in the measured system.

One skilled in the art will recognize that, in embodiments wherein at least one of terminals 402 is capacitively coupled with lidding film 104, using ERI to generate a map of electrical conductivity in region 406 would be difficult, if not impossible; however, EIT can be used to generating a map of electrical impedance within the region.

Figure 5:
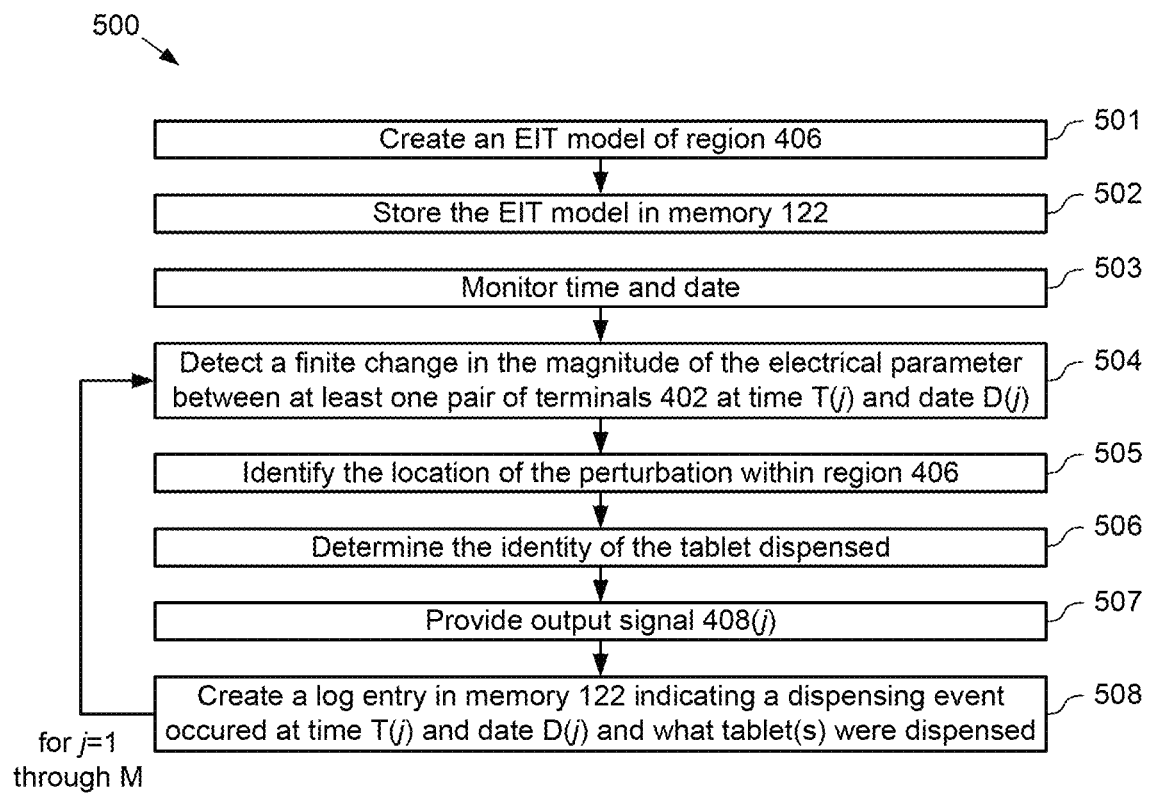
FIG. 5 depicts operations of an exemplary method suitable for monitoring the state of a blister pack in accordance with the first alternative embodiment.
Figure 6:
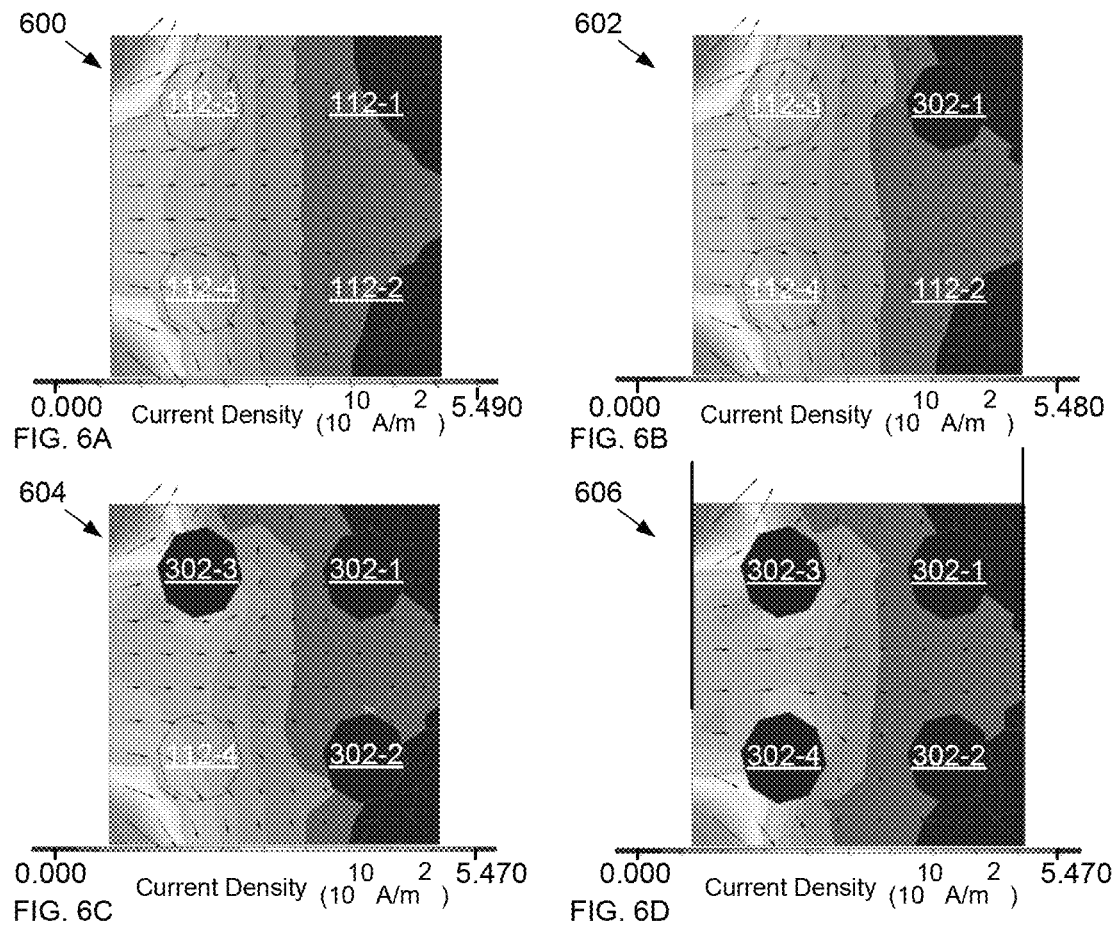
FIGS. 6A-D depict EIT models of region 406 for different possible configurations of openings at known tablet locations in an exemplary lidding film having four terminals arranged about its perimeter.

FIG. 5 depicts operations of an exemplary method suitable for monitoring the state of a blister pack in accordance with the first alternative embodiment. Method 500 begins with operation 501, wherein an EIT model of region 406 is created. The EIT model comprises a plurality of computed maps of the current density distribution throughout the region based on assumed electrical stimuli. Each map is based on a different anticipated configuration of openings in lidding film 104. Generating this plurality of computed maps is often referred to as "solving the forward problem."

FIGS. 6A-D depict EIT models of region 406 for different possible configurations of openings at known tablet locations in an exemplary lidding film having four terminals arranged about its perimeter. Each of plots 600-606 is based on a finite-element 2-D electrical model of current density distribution for a four-tablet blister card and assumed electrical stimuli.

Plot 600 depicts the current density distribution in lidding film 104 while in its original state (i.e., without any openings within region 118).

Plot 602 depicts the current density distribution in lidding film 104 after formation of an opening 302-1 at the location of tablet 112-1.

Plot 604 depicts the current density distribution in lidding film 104 after the additional formation of openings 302-2 and 303-3 at the locations of tablets 112-2 and 112-3.

Plot 606 depicts the current density distribution in lidding film 104 after the additional formation of opening 302-4 at the location of tablets 112-4.

It can be readily seen from plots 600-606 that the conductivity of each tablet-area changes each time a tablet 112 is dispensed. This change in the conductivity results in a significant change in the current density distribution in region 406 and the corresponding output voltages measured at terminals 402.

At operation 502, the EIT model of region 406 is stored as a look-up table in memory 122.

At operation 503, electronic circuitry 404 monitors date and time.

At operation 504, a finite change in the electrical parameter measured between at least one pair of terminals 402 is detected at date D(j) and time T(j), where j is an integer within the range of 1 through M, as discussed above and with respect to blister pack 100. This finite change equates to a perturbation in the conductivity map of region 406, which indicates a tablet-dispensing event at the location of one of tablets 112 has occurred.

At operation 505, the location of the perturbation within region 406 is identified. In some embodiments, the location of the perturbation is identified by comparing the measured EIT map to the modeling results stored in operation 502.

Figure 7:
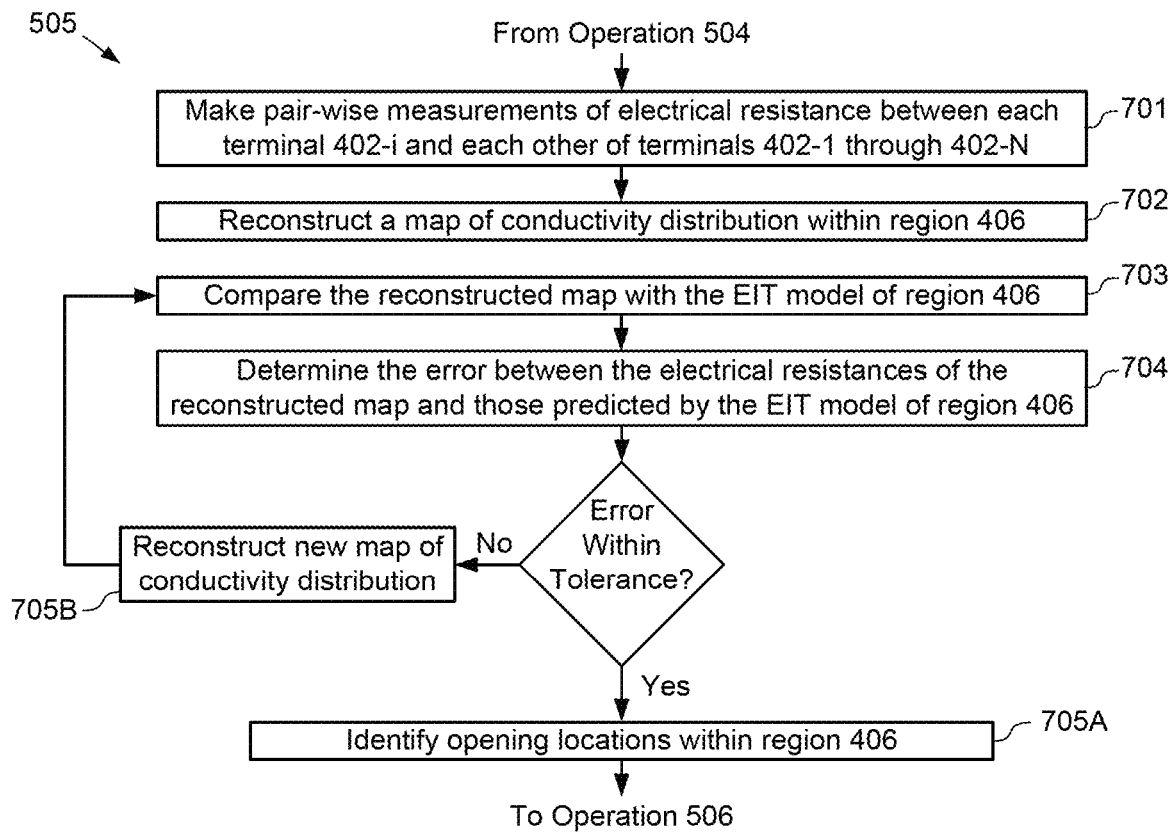
FIG. 7 depicts a sub-method suitable for determining the location of one or more openings in a blister pack in accordance with the first alternative embodiment.

FIG. 7 depicts a sub-method suitable for determining the location of one or more openings in a blister pack in accordance with the first alternative embodiment. Operation 505 begins with sub-operation 701, wherein pair-wise measurements of electrical resistance are made between each terminal 402-$i$ and each other terminal 402-1 through 402-($i$−1) and 402-($i$+1) through 402-N, where i is an integer within the range of 1 through N. Typically, the electrical resistance is determined by applying a plurality of currents to terminals 402 and measuring the resultant voltages at the same terminals. In some embodiments, at operation 501, pair-wise measurements of electrical impedance are made between each terminal 402-$i$ and each other terminal 402-1 through 402-($i$−1) and 402-($i$+1) through 402-N, where i is an integer within the range of 1 through N. These pair-wise measurements include, in the depicted example, the electrical resistance between terminal 402-1 and each of terminals 402-2 through 402-10, the electrical resistance between terminal 402-2 and each of terminals 402-3 through 402-10, the electrical resistance between terminal 402-3 and each of terminals 402-4 through 402-10, and so on.

In some embodiments, each pair-wise measurement made in sub-operation 701 includes the generation of an electric current between a first pair of terminals, which serve as the current source and sink, and the measurement of a potential difference between a second pair of terminals to determine the potential difference between their respective locations. In such embodiments, for a system with N terminals there are approximately $N^4$ different terminal configurations. Such pair-wise measurements are analogous to ERT methods described by LaBrecque in U.S. Pat. No. 8,733,432 and EIT measurements described by Duraiswami, et al., in "Efficient 2D and 3D EIT using dual reciprocity boundary element techniques."

For example, LaBrecque discloses, " . . . in ERT, each measurement uses four electrodes; one pair of electrodes serves as the current source and sink and a second pair measures the potential difference between two points. For a system with N electrodes there are approximately $N^4$ different configurations referred to as arrays." In similar fashion, Duraiswami discloses, "In electrical impedance tomography (EIT) the distribution of impedances inside an object ('image') is sought by applying specified currents at some electrodes, and performing measurements of the voltage at other electrodes. The equations for the electric field then provide a relationship between the impedance distribution inside the medium and the measured voltages and applied currents. Different kinds of materials have different impedances, and the availability of an impedance map provides an image of the material Distribution." One skilled in the art will recognize that ERT and EIT measurements, such as those described by LeBrecque and Duraiswami, are suitable for use in embodiments of the present invention.

At sub-operation 702, a map of conductivity distribution within region 406 is reconstructed from the measured electrical resistances.

At sub-operation 703, the reconstructed map is compared to those stored in memory 122.

At sub-operation 704, the error between the measured values of electrical resistance and the predicted values of electrical resistance between the terminals based on the EIT model of region 406.

At sub-operation 705A, if the error meets a specified threshold (i.e., is within a specified tolerance), a location of the perturbation in the conductivity map is identified as the site of a new opening 302 based on the reconstructed map of region 406.

At sub-operation 705B, if the error exceeds the specified threshold, a new conductivity distribution is reconstructed using an error minimization procedure and sub-operations 703-704 are repeated until the error meets the threshold.

Returning now to method 500, at operation 506, the identity of the tablet 112 dispensed by the formation of the new opening 302 is determined. Typically, a pharmaceutical blister pack contains multiple tablets of the same medication. In some embodiments, however, different types of tablets, or product units in non-pharmaceutical applications, are located at different locations within a single blister pack. For example, in some cases, a blister pack might contain different components of a "drug cocktail" that are intended to be taken together. Or, in an exemplary non-pharmaceutical application, a blister pack might include a printer ink cartridge for each of several different ink colors. In such embodiments, memory 122 typically includes a map or lookup table that corresponds to product type and location within the blister pack.

At operation 507, electronic circuitry 404 generates output signal 408(j). Output signal 408(j) is analogous to output signal 124(j) described above and with respect to blister pack 100; however, output signal 408(j) also includes information about the specific tablet 112 that was dispensed at date D(j) and time T(j).

At operation 508, electronic circuitry 404 creates a log entry in memory 122 that indicates that a dispensing event occurred at date D(j) and time T(j), and which also includes information about which tablet 112 or tablets were dispensed.

In some embodiments, placement of the terminals 402 on the periphery of region 406 is augmented or replaced with terminals 402 placed within the interior of the region. In some embodiments, the terminals may have more or less than four sides or may include non-rectilinear shapes.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A system for monitoring the state of blister packaging, wherein the system comprises:
   a first plurality of terminals configured to operatively couple with a blister pack that includes (i) a forming film and (ii) a lidding film that is continuous, electrically conductive, and unpatterned such that it does not include a patterned electrical trace, wherein the forming film and lidding film are joined to collectively define at least one reservoir that is configured to hold at least one tablet, each terminal being configured to electrically couple with a first region of the lidding film to enable electrical communication with each other terminal of the first plurality thereof through the first region, wherein the first region is electrically conductive and does not include a patterned electrical trace, and wherein the first plurality of terminals is arranged such that formation of a first opening in the first region at a first location gives rise to a first finite change in the magnitude of an electrical parameter measured between at least two terminals of the first plurality thereof; and electronic circuitry that is operative for (1) providing a first signal based on the first finite change in the magnitude of the electrical parameter.

2. The system of claim 1 wherein the electronic circuitry is further operative for (2) measuring the electrical parameter between each terminal and each other terminal of the first plurality thereof, (3) generating a first image of the first region via electrical resistance tomography (ERT) or electrical impedance tomography (EIT), and (4) determining the first location based on the first image.

3. The system of claim 2 wherein the first plurality of terminals is arranged such that formation of a second opening in the first region at a second location gives rise to a second finite change in the magnitude of an electrical parameter measured between at least two terminals of the first plurality thereof, and wherein the electronic circuitry is further operative for (5) generating a second image of the first region via electrical resistance tomography (ERT) or electrical impedance tomography (EIT), and (6) determining the second location based on the second image.

4. The system of claim 1 wherein the electronic circuitry is further operative for (2) determining a first time at which the first finite change in the magnitude is detected and (3) including an indicator of the first time in the first signal.

5. The system of claim 1 wherein at least one terminal of the first plurality thereof is configured to capacitively couple with the lidding film.

6. The system of claim 1 wherein the electrical parameter is selected from the group consisting of electrical resistance and electrical impedance.

7. The system of claim 1 wherein the lidding film has a first surface and at least one terminal of the first plurality thereof is formed on the first surface.

8. The system of claim 1 wherein the at least one reservoir is located within the first region, and wherein the first plurality of terminals includes a second plurality of terminals that are locatable on the periphery of the first region.

9. The system of claim 8 wherein the first plurality of terminals includes a third plurality of terminals, wherein at least one terminal of the third plurality thereof is located within the first region.

10. A system for monitoring the state of blister packaging, wherein the system comprises:

a first plurality of terminals configured to operatively couple with a blister pack that includes a first reservoir that is configured to hold at least one tablet, the blister pack including (i) a forming film that includes a first cavity and (ii) a lidding film that is continuous, electrically conductive, and unpatterned such that it does not include a patterned electrical trace, wherein the first cavity and a first dispensing region of the lidding film collectively define the first reservoir, wherein each terminal is, configured to electrically couple with a first region of the lidding film to enable electrical communication with each other terminal of the first plurality thereof through the first region, wherein the first region is electrically conductive and does not include a patterned electrical trace; and electronic circuitry that is operative for (1) performing a first plurality of pair-wise measurements of an electrical parameter between the terminals of the first plurality thereof and (2) generating a first image of at least a portion of the first region based on the first plurality of pair-wise measurements.

11. The system of claim 10 wherein the electronic circuitry is further operative for (3) performing a second plurality of pair-wise measurements of the electrical parameter between the terminals of the plurality thereof, (4) generating a second image of the first region based on the second plurality of pair-wise measurements, (5) performing a first comparison of the first image and second image, and (6) generating a first signal based on the first comparison.

12. The system of claim 11 wherein the first signal includes a first location that is based on a difference between the first image and the second image and a first time at which the first comparison was performed.

13. The system of claim 10 further comprising a memory module operative for storing a model of the first region, wherein the electronic circuitry is further operative for (3) performing a first comparison between the model and the first image and (4) generating a first signal based on the first comparison.

14. A method for monitoring the state of blister packaging, wherein the method comprises:

providing a plurality of terminals that are electrically couplable;

electrically coupling a plurality of terminals with a blister pack that includes (i) a forming film that includes a first cavity and (ii) a lidding film that is continuous, electrically conductive, and unpatterned such that it does not include a patterned electrical trace, wherein the forming film and lidding film are joined to collectively define at least one reservoir that is configured to hold at least one tablet, wherein the plurality of terminals is electrically coupled with a first region of the lidding film to establish electrical communication between each terminal of the plurality thereof and every other terminal of the plurality thereof through the first region, wherein the first region is electrically conductive and does not include a patterned electrical trace, and wherein the plurality of terminals is arranged such that the formation of a first opening in the first region at a first location gives rise to a first finite change in the magnitude of an electrical parameter between first and second terminals of the plurality thereof;

performing a first measurement of the electrical parameter between the first and second terminals; and generating a first signal based on the first measurement.

15. The method of claim 14 wherein the first electrical parameter is selected from the group consisting of electrical resistance and electrical impedance.

16. The method of claim 14 further comprising forming at least one terminal of the plurality thereof on the lidding film.

17. The method of claim 14 further comprising:

performing a first plurality of pair-wise measurements of an electrical parameter between the terminals of the plurality thereof at a first time, the first plurality of pair-wise measurements including the first measurement;

generating a first map of an electrical parameter for the first region via a first measurement technique selected from the group consisting of electrical resistance tomography (ERT) and electrical impedance tomography (EIT), wherein the first map is based on the first plurality of pair-wise measurements of the electrical parameter; and comparing the first map to a second map of the electrical parameter for the first region.

18. The method of claim 17 further comprising generating the second map via the first measurement technique.

19. The method of claim 17 wherein the first signal is generated based on a first difference between the first map and the second map.

20. The method of claim 19 wherein the first signal is generated such that it identifies the first location based on the first difference.

21. The method of claim 19 wherein the first signal is generated such that it includes the first time.

* * * * *